United States Patent [19]
Naito et al.

[11] Patent Number: 5,405,466
[45] Date of Patent: Apr. 11, 1995

[54] METHOD OF MANUFACTURING MULTILAYER CERAMIC ELECTRONIC COMPONENT

[75] Inventors: Yasuyuki Naito; Tetsuya Doi; Yoshiki Hasegawa; Tadashi Morimoto; Yukio Tanaka, all of Nagaokakyo, Japan

[73] Assignee: Murata Manufacturing Co., Ltd., Kyoto, Japan

[21] Appl. No.: 118,971

[22] Filed: Sep. 9, 1993

[30] Foreign Application Priority Data

Sep. 11, 1992 [JP] Japan .................. 4-242483
Feb. 22, 1993 [JP] Japan .................. 5-031683

[51] Int. Cl.⁶ .................................................. C04B 37/00
[52] U.S. Cl. .................................. 156/89; 419/10
[58] Field of Search ............... 156/89; 264/61, 65; 419/10

[56] References Cited

U.S. PATENT DOCUMENTS

| | | | |
|---|---|---|---|
| 3,920,781 | 11/1975 | Eror et al. | 264/61 |
| 4,082,906 | 4/1978 | Amin et al. | 156/89 |
| 4,641,425 | 2/1987 | Dubuisson et al. | 264/61 |
| 4,861,646 | 8/1989 | Barringer et al. | 156/89 |
| 5,073,180 | 12/1991 | Farooq et al. | 156/89 |

OTHER PUBLICATIONS

Patent Abstracts of Japan 04–61215, E1216, vol. 16, No. 263 published Jun. 15, 1992.

*Primary Examiner*—Christopher A. Fiorilla
*Attorney, Agent, or Firm*—Ostrolenk, Faber, Gerb & Soffen

[57] ABSTRACT

A method of manufacturing a multilayer ceramic electronic component including a step of firing a ceramic green sheet laminate having internal electrodes containing at least one of palladium and silver, and a step of firing the ceramic green sheet laminate in a furnace having an oxygen partial pressure of not more than 5% in a temperature area exceeding 50° C. during a temperature rise from 400° C. to 1100° C.

6 Claims, 3 Drawing Sheets

METHOD OF MANUFACTURING MULTILAYER CERAMIC ELECTRONIC COMPONENT

BACKGROUND OF THE INVENTION

1. Field of the Invention

The present invention relates to a method of manufacturing a multilayer ceramic electronic component, and more particularly, it relates to a method of manufacturing a multilayer ceramic electronic component having internal electrodes, such as a multilayer ceramic capacitor, a multilayer actuator or a multilayer chip coil, for example.

3. Description of the Background Art

In general, a multilayer ceramic electronic component having internal electrodes of palladium and/or silver is formed by burning a binder or the like and thereafter increasing the temperature of a ceramic green sheet laminate in the air or oxygen for firing the same.

In such a conventional firing method, however, structural defects such as delamination and cracking may take place in the sintered body. Particularly when the multilayer ceramic electronic component is prepared from at least tens of green sheets, more particularly 100 or more green sheets, this leads to remarkable occurrence of such delamination and the like. However, it is necessary to stack a large number of green sheets in order to attain large capacitance in a multilayer capacitor, for example.

SUMMARY OF THE INVENTION

An object of the present invention is to provide a method of manufacturing a multilayer ceramic electronic component which can reduce occurrence of structural defects such as delamination and cracking in firing. The manufacturing method according to the present invention comprises a step of preparing a ceramic green sheet laminate having internal electrodes containing at east one of palladium and silver, and a step of firing the ceramic green sheet laminate in a furnace having an oxygen partial pressure of not more than 5% in a temperature area exceeding 50° C. during a temperature rise from 400° C. to 1100° C.

When the internal electrodes contain 50 to 80 percent by weight of palladium and silver forming at least parts of the remainders, the ceramic green sheet laminate is preferably fired in a furnace having an oxygen partial pressure of not more than 5% in a temperature area exceeding 50° C. during a temperature rise from 500° C. to 900° C.

While the oxygen partial pressure is not more than 5% in a prescribed temperature area during a temperature rise according to the present invention, the oxygen partial pressure may remain below 5% also in a prescribed temperature area during temperature reduction. It is possible to further sufficiently prevent occurrence of delamination and cracking by providing a temperature area with an oxygen partial pressure of not more than 5% also in temperature reduction.

According to the present invention, the furnace has an oxygen partial pressure of not more than 5% in a temperature area exceeding 50° C. within the temperature range of 400° C. to 100° C. when the ceramic green sheet laminate is heated from the room temperature to a firing temperature to be fired. It is possible to obtain a sintered body having small structural defects such as delamination and cracking by employing such a firing method. While the reason for this is not yet clarified in detail, it is conceivably possible to prevent oxidation and expansion of silver and/or palladium, forming the internal electrodes, by firing the laminate under a low oxygen partial pressure in the prescribed temperature area.

According to the present invention, it is possible to obtain a sintered body having small structural defects such as delamination and cracking, whereby a multilayer ceramic electronic component having excellent quality can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
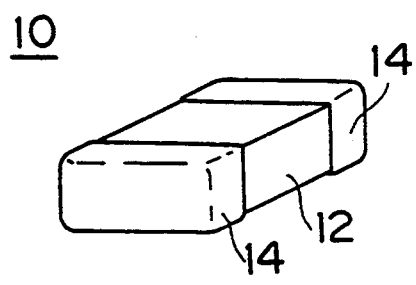
FIG. 1A is a perspective view showing a multilayer ceramic capacitor obtained according to an embodiment of the present invention.
Figure 1B:
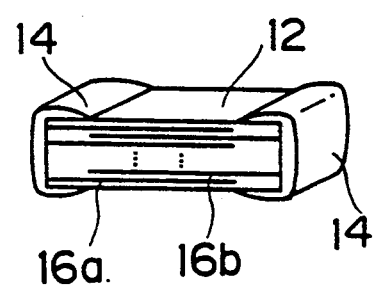
FIG. 1B is a partially fragmented perspective view of the multilayer ceramic capacitor shown in FIG. 1A.

FIG. 1A is a perspective view showing an exemplary multilayer ceramic capacitor obtained according to an embodiment of the inventive manufacturing method. Referring to FIG. 1A, external electrodes 14 are formed on both ends of a sintered body chip 12. As shown in FIG. 1B, internal electrodes 16a and 16b are alternately stacked in a ceramic element assembly provided in the interior of this chip 12.

The multilayer ceramic capacitor shown in FIGS. 1A and 1B can be manufactured in the following method:

First, organic resin is added to ceramic dielectric powder which is mainly composed of barium titanate, to prepare a ceramic slurry. This ceramic slurry is employed to prepare a ceramic green sheet, which is cut into proper dimensions.

Figure 2:
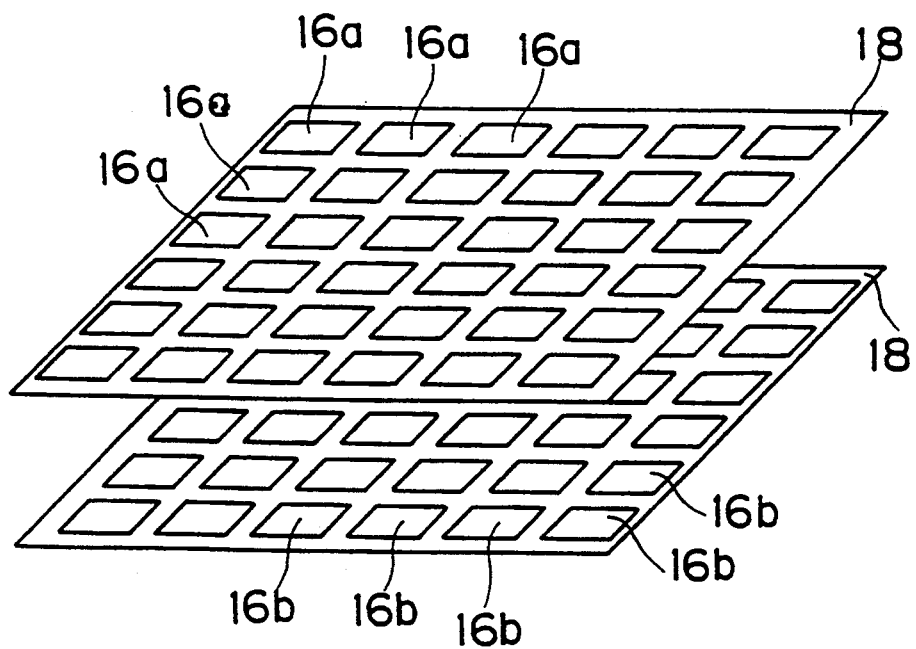
FIG. 2 is a perspective view showing ceramic green sheets employed in the embodiment of the present invention.

Referring to FIG. 2, conductive paste which is mainly composed of silver and/or palladium is applied to upper surfaces of such ceramic green sheets 18 as cut, to form internal electrodes 16a and 16b in prescribed patterns.

Figure 3:
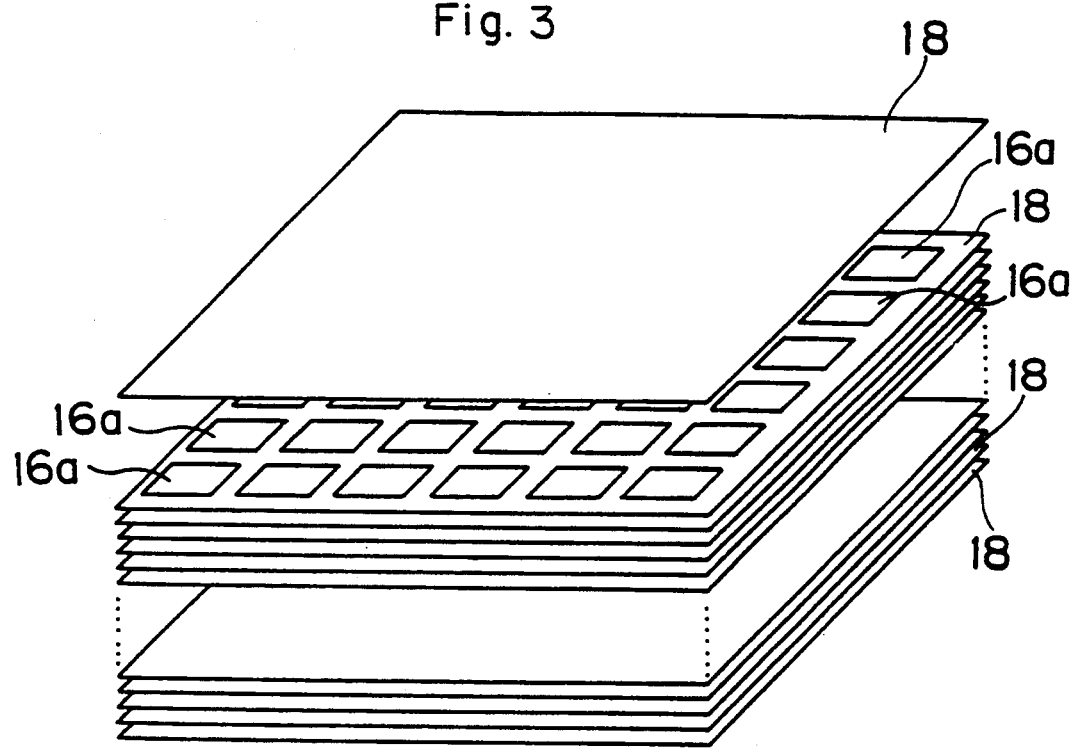
FIG. 3 is a perspective view showing a plurality of the ceramic green sheets, appearing in FIG. 2, which are stacked with each other.

Referring to FIG. 3, a number of ceramic green sheets 18 provided with the internal electrodes 16a are then alternately stacked with a number of ceramic green sheets 18 provided with the internal electrodes 16b. Further, ceramic green sheets 18 provided with no internal electrodes are stacked on uppermost and lowermost layers and the ceramic green sheets 18 are compression-bonded to each other, thereby forming a laminate.

Figure 4:
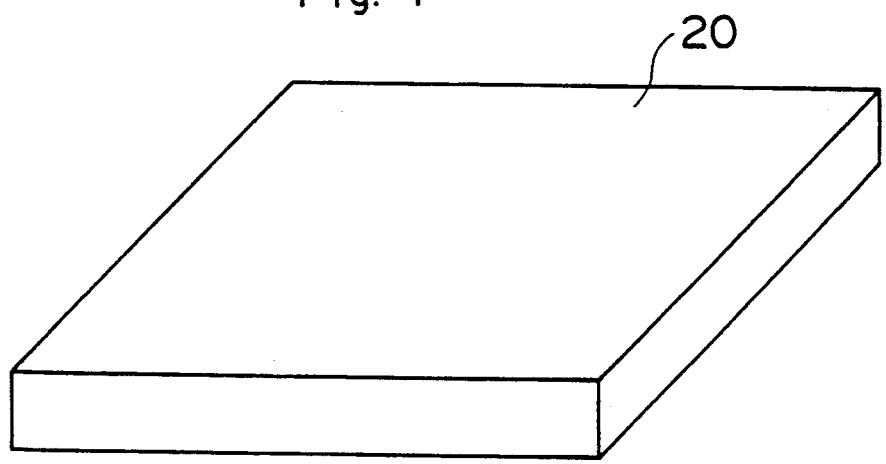
FIG. 4 is a perspective view showing a laminate obtained by stacking the ceramic green sheets in the state shown in FIG. 3.
Figure 5A:
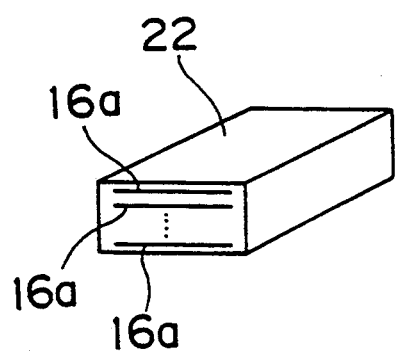
FIG. 5A is a perspective view showing a ceramic green sheet laminate for one unit of a multilayer ceramic capacitor obtained by cutting the laminate shown in FIG. 4.
Figure 5B:
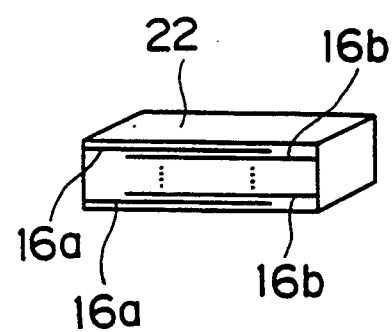
FIG. 5B is a partially fragmented perspective view of the ceramic green sheet laminate shown in FIG. 5A.

FIG. 4 shows the obtained laminate 20. This laminate 20 is cut into prescribed dimensions, to obtain a chip 22 of a ceramic green sheet laminate corresponding to one unit of a multilayer ceramic capacitor, as shown in FIG. 5A. The internal electrodes 16a and 16b are alternately stacked in this chip 22, as shown in FIG. 5B. This chip 22 is so fired as to obtain the chip 12 shown in FIGS. 1A and 1B.

Description is now made on samples of ceramic green sheet laminates according to Example of the present invention having internal electrodes containing silver and palladium in weight ratios shown in Table 2. These samples were fired under conditions shown in Table 1. Each of the ceramic green sheet laminates was prepared from 120 green sheets in total.

TABLE 1

| Step | Temperature(°C.) | Time (min.) | Temperature Change Rate(°C/min) |
|---|---|---|---|
| 1 | room temperature to 300 | — | 0.2 |
| 2 | 300 | 60 | — |
| 3 | 300 to $T_1$ | — | 3.33 |
| 4 | $T_1$ to $T_2$ | — | 3.33 |
| 5 | $T_2$ | 60 | — |
| 6 | $T_2$ | 60 | — |
| 7 | $T_2$ to $T_3$ | — | 3.33 |
| 8 | $T_3$ | 120 | — |
| 9 | $T_3$ to room temperature | — | 5.00 |

As shown in Table 1, the temperature in a furnace as employed was increased from the room temperature to 300° C. at a temperature change rate of 0.2° C./min. at a step 1 in each sample. Then, the furnace was maintained at the temperature of 300° C. for 60 minutes, in order to remove moisture and organic resin from the chip of the ceramic green sheet at a step 2. Thereafter the temperature of the furnace was further increased from 300° C. to a temperature $T_1$ at a temperature change rate of 3.33° C./min. at a step 3. Table 2 shows the temperature $T_1$ for each sample.

Then, the furnace was Filled with $N_2$ gas to attain an oxygen partial pressure shown in Table 2, and the temperature of the furnace was increased from $T_1$ to $T_2$ at a temperature change rate of 3.33° C./min. at a step 4. Table 2 also shows the temperature $T_2$ for each sample.

Then, the furnace was maintained at the temperature $T_2$ for 60 minutes at a step 5, under the oxygen partial pressure which was left intact. Then, the furnace was returned to an atmosphere of the air, and maintained at the temperature $T_2$ further for 60 minutes at a step 6.

Then, the temperature in the furnace was further increased from $T_2$ to $T_3$ at a temperature change rate of 3.33° C./min. at a step 7. Table 2 shows the temperature $T_3$ for each sample. Then, the furnace was maintained at the temperature $T_3$ for 120 minutes at a step 8. Then, the temperature of the furnace was reduced from $T_3$ to the room temperature at a rate of 5.00° C./min. at a step 8.

As to the steps shown in Table 1, the steps 4 and 5 correspond to those under an oxygen partial pressure of not more than 5% characterizing the present invention. Thus, the furnace has an oxygen partial pressure of not more than 5% in a temperature area between $T_1$ and $T_2$.

The samples having the internal electrodes containing silver and palladium in the weight ratios shown in Table 2 were fired under the firing conditions of the temperatures $T_1$, $T_2$ and $T_3$ and oxygen partial pressures shown in Table 2. Defective percentages of the obtained multilayer ceramic capacitors were evaluated, assuming that products having delamination and cracking were defective.

Referring to Table 2, asterisked (*) samples, which were Fired under conditions out of the scope of the present invention, indicate comparative samples.

TABLE 2

| Sample | Ag/Pd | $T_1$ (°C.) | $T_2$ (°C.) | $T_3$ (°C.) | Oxygen Partial Pressure | Defective Percentage |
|---|---|---|---|---|---|---|
| 1 | 0/10 | 800 | 1100 | 1320 | 3% | 0.3% |
| *2 | 0/10 | 800 | 1200 | 1320 | 3% | 3.2% |
| *3 | 3/7 | 600 | 800 | 1260 | 7% | 4.7% |
| 4 | 3/7 | 600 | 800 | 1260 | 5% | 0.1% |
| 5 | 3/7 | 600 | 800 | 1260 | 3% | 0.0% |
| 6 | 3/7 | 600 | 800 | 1260 | 1% | 0.1% |
| 7 | 3/7 | 600 | 800 | 1260 | 0.5% | 0.2% |
| 8 | 3/7 | 650 | 750 | 1260 | 3% | 0.1% |
| 9 | 3/7 | 650 | 700 | 1260 | 3% | 0.2% |
| *10 | 3/7 | 650 | 680 | 1260 | 3% | 1.0% |
| 11 | 7/3 | 500 | 700 | 1060 | 3% | 0.1% |
| 12 | 7/3 | 400 | 700 | 1060 | 3% | 0.3% |
| *13 | 7/3 | 300 | 700 | 1060 | 3% | 7.8% |

As clearly understood from Table 2, it is possible to remarkably reduce the defective percentage by firing the laminate according to the present invention. The comparative sample 2 had a temperature $T_2$ of 1200° C., which was out of the inventive range, while the comparative sample 3 had an oxygen partial pressure of 7%, which was out of the inventive range. Further, the comparative sample 10 had a difference of 30° C., which was out of the inventive range, between the temperatures $T_1$ and $T_2$, while the comparative sample 13 had a temperature $T_1$ of 300° C., which was out of the inventive range. All of these comparative samples exhibited defective percentages which were higher than those of the inventive samples.

Then, the samples of ceramic green sheet laminate chips provided with the internal electrodes containing silver and palladium in weight ratios of 0/10, 5/7 and 7/3 as shown in Table 2 were fired under conditions shown in Table 3.

TABLE 3

| Step | Temperature(°C.) | Time(min.) |
|---|---|---|
| 1 | room temperature to 300 | 1500 |
| 2 | 300 | 60 |
| 3 | 300 to 600 | 90 |
| 4 | 600 to 800 | 60 |
| 5 | 800 | 60 |
| 6 | 800 | 60 |
| 7 | 800 to 1260 | 138 |
| 8 | 1260 | 120 |
| 9 | 1260 to 800 | 92 |
| 10 | 800 to 600 | 40 |
| 11 | 600 to room temperature | 120 |

Under the firing conditions shown in Table 3, an oxygen partial pressure of 3% was provided in the furnace for each sample at the steps 4, 5 and 10. Thus, an atmosphere having a low oxygen partial pressure characterizing the present invention was provided for these steps. Each sample fired under such conditions exhibited a delamination percentage of 0%.

Description is now made on Example according to a preferred mode of the present invention. According to the preferred mode of the present invention, internal electrodes contain 60 to 80 percent by weight of palladium and silver forming at least parts of the remainders, and a laminate is fired in a furnace having an oxygen partial pressure of not more than 5% in a temperature area exceeding 50° C. during a temperature rise from 500° C. to 900° C.

Samples were fired through steps identical to those shown in Table 1, with temperatures $T_1$, $T_2$ and $T_3$ shown in Table 4. Referring to Table 4, asterisked (*) samples are out of the scope of the preferred mode of the present invention.

TABLE 4

| Sample | Ag/Pd | $T_1$ (°C.) | $T_2$ (°C.) | $T_3$ (°C.) | Oxygen Partial Pressure | Defective Percentage |
| --- | --- | --- | --- | --- | --- | --- |
| *1 | 1/9 | 700 | 900 | 1300 | 3% | 1.1% |
| 2 | 2/8 | 700 | 900 | 1280 | 3% | 0.2% |
| *3 | 2/8 | 800 | 1000 | 1280 | 3% | 2.1% |
| 4 | 3/7 | 600 | 800 | 1260 | 1% | 0.1% |
| 5 | 3/7 | 600 | 800 | 1260 | 3% | 0.0% |
| 6 | 3/7 | 600 | 800 | 1260 | 5% | 0.1% |
| *7 | 3/7 | 600 | 800 | 1260 | 7% | 4.7% |
| 8 | 3/7 | 650 | 750 | 1260 | 3% | 0.1% |
| 9 | 3/7 | 650 | 700 | 1260 | 3% | 0.2% |
| *10 | 3/7 | 650 | 680 | 1260 | 3% | 1.0% |
| *11 | 4/6 | 400 | 600 | 1230 | 3% | 1.5% |
| 12 | 4/6 | 500 | 700 | 1230 | 3% | 0.2% |
| *13 | 5/5 | 500 | 700 | 1200 | 3% | 0.9% |

As clearly understood from Table 4, defective percentages were extremely reduced in the samples 2, 4, 5, 6, 8, 9 and 12 according to the preferred mode of the present invention. On the other hand, the comparative sample 1 had high palladium contents in the internal electrodes, while the comparative sample 3 had a temperature $T_2$ exceeding 900° C. The comparative sample 7 had a high oxygen partial pressure and the comparative sample 10 had a difference of 30° C. between the temperatures $T_1$ and $T_2$, while the comparative sample 11 had a temperature $T_1$ lower than 500° C. and the comparative sample 13 had low palladium contents in the internal electrodes. These comparative samples exhibited high defective percentages. In particular, the comparative sample 7 having an oxygen partial pressure of 7% exhibited an extremely high defective percentage.

Samples of ceramic green sheet laminates having internal electrodes containing silver and palladium in weight ratios of 1/9, 2/8, 3/7, 4/6 and 5/5 as shown in Table 4 were fired through steps identical to those shown in Table 3. In each sample, the furnace had an oxygen partial pressure of 3% at the steps 4, 5 and 10. Consequently, each sample exhibited a delamination percentage of 0%, similarly to the above Example. Thus, it is understood that provision of a low oxygen partial pressure in a prescribed temperature area leads to a preferable effect also in relation to temperature reduction.

Although the internal electrodes are prepared from electrode paste which is mainly composed of metal powder of silver and/or palladium in the above description, the internal electrodes may alternatively be formed by another method. Further, the internal electrodes may contain metal components other than silver and palladium.

Although the above description has been made with reference to a multilayer ceramic capacitor, the present invention is also applicable to other general multilayer ceramic electronic components such as an multilayer actuator and a chip coil.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a multilayer ceramic electronic component comprising the steps of:

providing a ceramic green sheet having internal electrodes containing mainly at least one of a metal selected from the group consisting of palladium and silver;

heating said green sheet laminate in air to a first temperature which is in the range of 400° C. to 1100° C.;

heating said green sheet laminate from said first temperature to a second temperature at an oxygen partial pressure of not more than 5%, wherein said second temperature is in the range of 400° C. to 1100° C. and is more than 50° C. higher than said first temperature; and further heating said ceramic green sheet laminate from said second temperature to a firing temperature such that a sintered electronic component is produced, wherein said further heating is conducted in air.

2. A manufacturing method in accordance with claim 1, further comprising the step of:

reducing the temperature from a third temperature to a fourth temperature at an oxygen partial pressure of not more than 5% after said further heating, wherein said third and fourth temperatures are in the range of 1100° C. to 400° C. and said third temperature is more than 50° C. higher than said fourth temperature.

3. A manufacturing method in accordance with claim 1 wherein said first and second temperatures are in the range of 600° C. to 800° C., said oxygen partial pressure from said first temperature to said second temperature is not more than 3%, said third and fourth temperatures are in the range of 800° C. to 600° C., and said oxygen partial pressure from said third temperature to said fourth temperature is not more than 3%.

4. A method of manufacturing a multilayer ceramic electronic component comprising the steps of:

providing a ceramic green sheet having internal electrodes containing 60 to 80 percent by weight of palladium, and silver forming at least part of the balance;

heating said green sheet laminate in air to a first temperature which is in the range of 500° C. to 900° C.;

heating said green sheet laminate from said first temperature to a second temperature at an oxygen partial pressure of not more than 5%, wherein said second temperature is in the range of 500° C. to 900° C. and is more than 50° C. higher than said first temperature; and further heating said ceramic green sheet laminate from said second temperature to a firing temperature such that a sintered electronic component is produced, wherein said further heating is conducted in air.

5. A manufacturing method in accordance with claim 4, further comprising the step of:

reducing the temperature from a third temperature to a fourth temperature at an oxygen partial pressure of not more than 5% after said further heating, wherein said third and fourth temperatures are in the range of 900° C. to 500° C. and said third temperature is more than 50° C. higher than said fourth temperature.

6. A manufacturing method in accordance with claim 4 wherein said first and second temperatures are in the range of 600° C. to 800° C., said oxygen partial pressure from said first temperature to said second temperature is not more than 3%, said third and fourth temperatures are in the range of 800° C. to 600° C., and said oxygen partial pressure from said third temperature to said fourth temperature is not more than 3%.

* * * * *